United States Patent
Roithmeier et al.

(10) Patent No.: US 10,651,857 B2
(45) Date of Patent: May 12, 2020

(54) FREQUENCY BASED BIAS VOLTAGE SCALING FOR PHASE LOCKED LOOPS

(71) Applicant: Intel IP Corporation, Santa Clara, CA (US)

(72) Inventors: Andreas Roithmeier, Munich (DE); Thomas Gustedt, Munich (DE); Herwig Dietl-Steinmaurer, Wels (AT); Christian Wicpalek, Puchenau (AT)

(73) Assignee: Apple Inc., Cupertino, CA (US)

( * ) Notice: Subject to any disclaimer, the term of this patent is extended or adjusted under 35 U.S.C. 154(b) by 804 days.

(21) Appl. No.: 15/194,999

(22) Filed: Jun. 28, 2016

(65) Prior Publication Data
US 2017/0373694 A1    Dec. 28, 2017

(51) Int. Cl.
*H03L 7/083* (2006.01)
*H03L 7/099* (2006.01)
*H03L 7/08* (2006.01)

(52) U.S. Cl.
CPC ............ *H03L 7/083* (2013.01); *H03L 7/0802* (2013.01); *H03L 7/099* (2013.01); *H03L 2207/06* (2013.01)

(58) Field of Classification Search
CPC ......... H03L 7/083; H03L 7/085; H03L 7/087; H03L 7/089; H03L 7/0891–0898
See application file for complete search history.

(56) References Cited

U.S. PATENT DOCUMENTS

| | | |
|---|---|---|
| 5,656,975 A | 8/1997 | Imura |
| 2007/0152734 A1 | 7/2007 | Senthinathan |
| 2014/0266475 A1* | 9/2014 | Hinrichs .............. H03K 3/0315 331/57 |
| 2016/0094231 A1* | 3/2016 | Li ......................... H03L 1/022 331/15 |
| 2016/0182065 A1 | 6/2016 | Wicpalek et al. |

OTHER PUBLICATIONS

European Search Report dated Nov. 7, 2017 in connection with European Application No. 17174107.7.

* cited by examiner

*Primary Examiner* — Patrick C Chen
(74) *Attorney, Agent, or Firm* — Eschweiler & Potashnik, LLC

(57) ABSTRACT

A phase locked loop system includes bias voltage adjustment circuitry and a voltage regulator that outputs a smoothed core voltage to an oscillator. The bias voltage adjustment circuitry is configured to compute a scaled bias voltage based at least on a target frequency for the oscillator. The voltage regulator is configured to input i) the scaled bias voltage and ii) a selected core voltage that is selected based on the target operating frequency of the oscillator and generate the smoothed core voltage for output to the oscillator.

19 Claims, 6 Drawing Sheets

FREQUENCY BASED BIAS VOLTAGE SCALING FOR PHASE LOCKED LOOPS

BACKGROUND

Phase locked loops (PLLs) can provide precise generation and alignment of timing for a wide variety of applications, such as for clock generation or clock data recovery. Digital phase-locked loops (DPLLs) are a viable alternative to traditional PLLs, in which a digital loop filter can be utilized to replace analog components. For example, all-digital phase locked loops (ADPLLs) are designed to utilize digital techniques throughout and can comprise a phase frequency detector, a loop filter, an oscillator, and a frequency divider. ADPLLs, as with other DPLLs, utilize a high-frequency clock source because they do not provide a true frequency synthesis. The oscillator is thus an important component involved in tuning the DPLL, which can involve coarse tuning and fine tuning operations.

The frequency of the signal output by the oscillator is adjusted by one or more tuning capacitor arrays such as one array for open loop band adjustment and another array for closed loop tuning. For example, coarse tuning (e.g., tuning a capacitor array for a band adjustment) can be implemented with a capacitor that is controlled by a binary coding, in which the coarse tuning process selects a frequency band. During the locking operation phase for a target frequency of operation and after coarse tuning, the coarse tuning is kept constant and the frequency resolution of the phase locked loop is enhanced with a fine tuning operation (e.g., setting a fine tuning field for locking the phase locked loop) in order to compensate for the error in the coarse tuning and to lock the oscillator at the target frequency.

DETAILED DESCRIPTION

Figure 1:
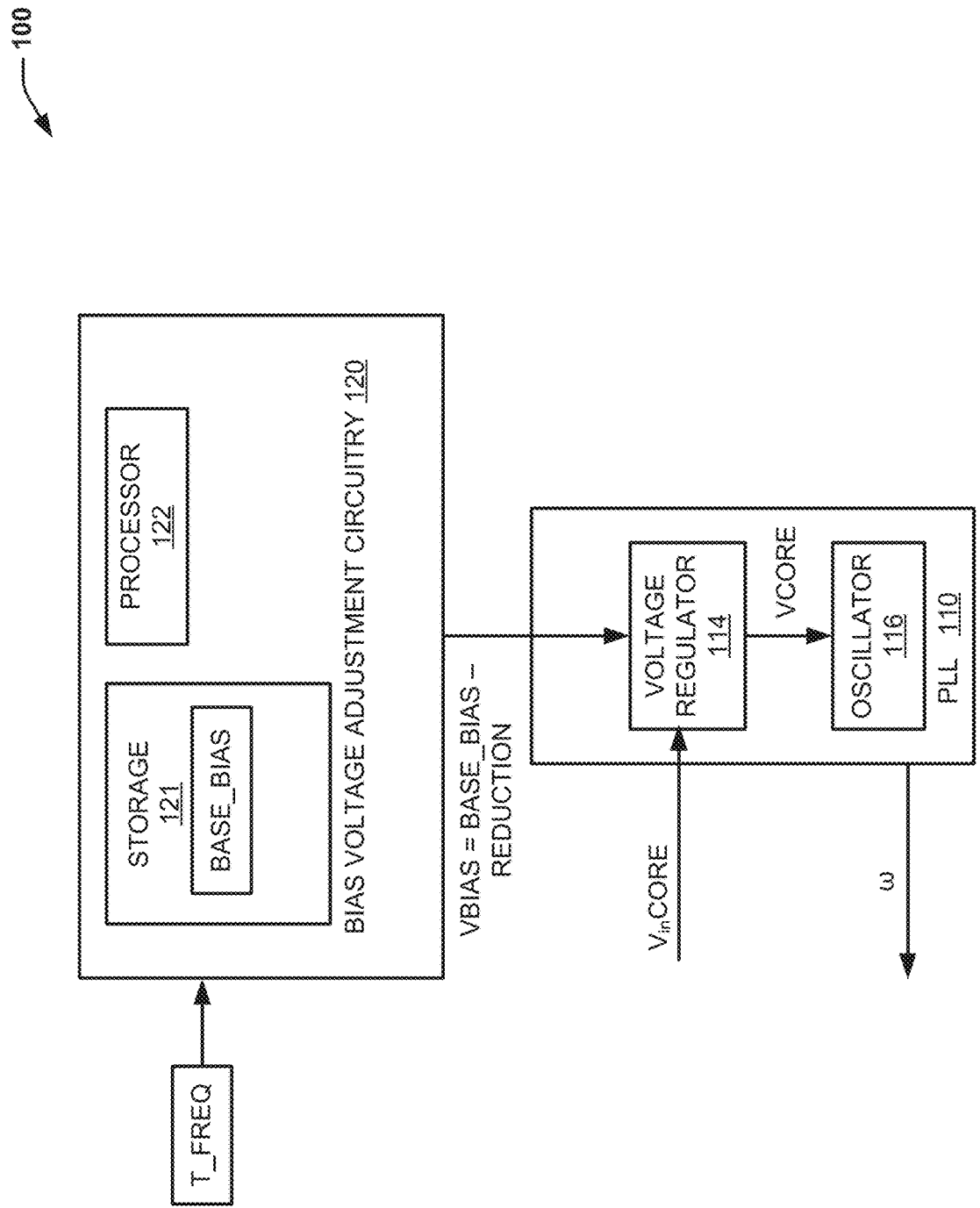
FIG. 1 illustrates an exemplary phase locked loop system that includes bias voltage adjustment circuitry configured to scale a bias voltage for individual PLLs in accordance with various aspects described.

A PLL generates an output signal with a phase that is related to the phase of an input signal based on an oscillator or an oscillator circuit. The frequency based bias voltage scaling disclosed herein can operate with oscillators, such as a digital controlled oscillator (DCO), a voltage controlled oscillator (VCO) or the like, for example, for multiple different frequency synthesizing operations. The phase locked loop systems discussed can operate to synthesize or synchronize signals, which can track an input frequency or phase and generate a frequency or phase that is a multiple of the input frequency.

When a target frequency is first selected, a core voltage is selected that is associated with a selected target frequency for the oscillator. The core voltage is the voltage that is applied to the core of the oscillator. Then the PLL undergoes a coarse tuning process, which is performed in an open loop configuration or operational state that is before the PLL is locked or latched for generating a uniform or consistent output. During coarse tuning, a coarse tuning (CT) value (also called a coarse control word CCW) is determined, which controls enabling and disabling of capacitors in a coarse tuning array of the oscillator. The PLL is then locked in response to the input and output frequencies being operationally set to be approximately the same frequency, in which the feedback loop of the PLL is closed. Once the feedback loop is closed, fine tuning adjustments are made by way of a fine tuning capacitor array.

Saving current consumption in transceivers is important to extend the operation time of user equipment devices. Phase locked loops (PLLs) are an important part of a device's transceiver, where they are used to generate clock signals and carrier waves. The oscillator in each PLL in the transceiver consumes a significant amount of current. For example, the core voltage, which varies depending on the target frequency, is typically produced by a voltage regulator that inputs a bias voltage and a selected core voltage and outputs a constant, smooth core voltage to the oscillator core. The bias voltage for the voltage regulator is thus one component of the power consumption of the oscillator.

There are several benefits to selecting a bias voltage that is close to the core voltage that will be output by the voltage regulator. One reason is that keeping the bias voltage as low as possible conserves power. Another reason is that the quality of the voltage regulator output may improve as the core voltage approaches the "drop out voltage" of the regulator, which is the bias voltage reduced by the voltage drop across the regulator.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for PLLs including frequency based bias voltage scaling are described herein. The base bias voltage for a PLL may be scaled down based at least on the target frequency for the oscillator. This enables a low bias voltage to be utilized when the target frequency is relatively high, conserving power and improving core voltage quality.

FIG. 1 illustrates a PLL system 100 that includes one or more PLLs 110 and one embodiment of bias voltage adjustment circuitry 120. The PLL 110 includes a voltage regulator 114 and an oscillator 116. The voltage regulator 114 produces a core voltage VCORE that is applied to the core of the oscillator 116. It is important to the operation of the oscillator 116 that VCORE is stable and consistent. To this end, the voltage regulator 114 is configured to output a portion of a bias voltage VBIAS as VCORE. The core voltage being smoothed by the voltage regulator 114 is VBIAS. VBIAS is selected based on the desired operating point (e.g., frequency band) of the oscillator 116. In one embodiment, the voltage regulator 114 is a low dropout regulator, which is a voltage regulator circuit designed to limit the voltage drop through the circuit.

Bias voltage adjustment circuitry 120 is configured to calculate a bias voltage that is suitable for a given PLL based on the target frequency. When possible, the bias voltage adjustment circuitry 120 reduces the base bias voltage (BASE_BIAS) for the oscillator by subtracting a reduction value REDUCTION from the base bias voltage. The base bias value may be set based on the type of oscillator and stored in memory (e.g., storage 121) as associated with an oscillator. The reduction value (REDUCTION) is calculated by the bias voltage adjustment circuitry 120 based at least on the target frequency (T_FREQ) for the PLL. The resulting scaled bias voltage VBIAS is provided to the PLL. While in the described embodiments, the base bias voltage is scaled by subtracting a reduction value, other methods of scaling, such as multiplying by a scaling factor, looking up stored scale values mapped to target frequencies, and so on, may be used in other embodiments.

The bias voltages for different PLLs in a PLL system can differ because the frequency of the signals being produced by the oscillators could be different. Further, the bias voltage for a given PLL may be changed by the bias voltage adjustment circuitry 120 when a new target frequency is introduced. In one embodiment, the base bias voltage for each PLL is scaled to be as low as possible while supporting the present value of $V_{in}$CORE (which will be a function of target frequency T_FREQ), with an acceptable margin of error to reduce power consumption and improve voltage regulator performance.

Figure 2:
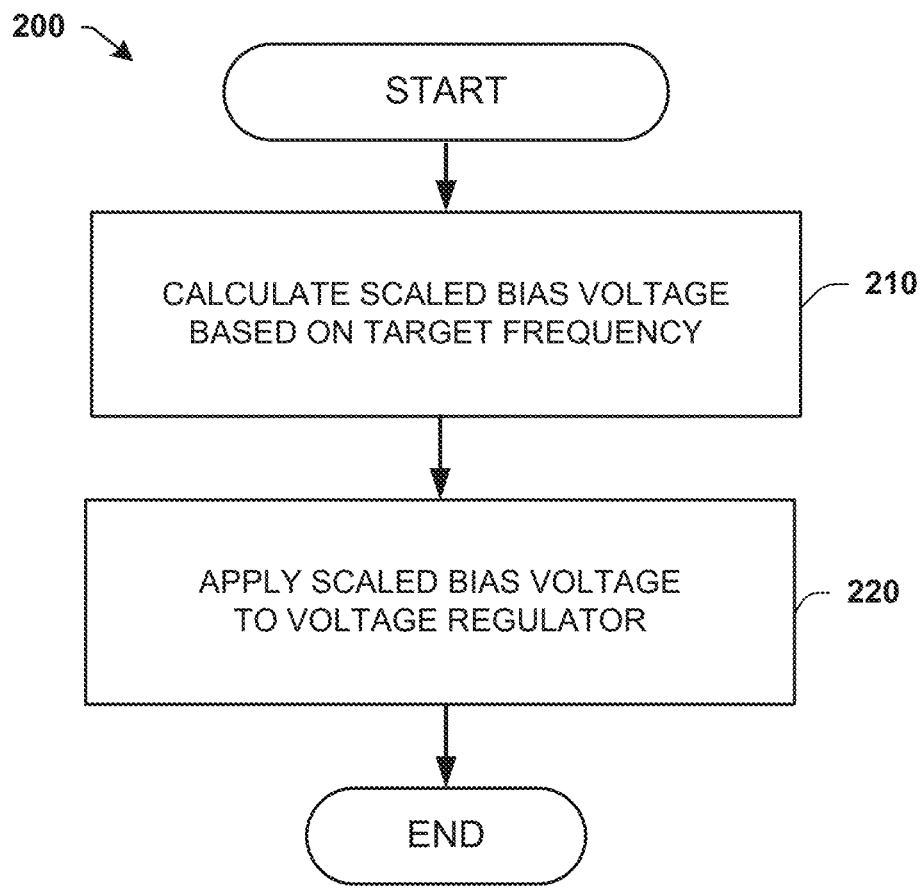
FIG. 2 illustrates another exemplary phase locked loop system that includes bias voltage adjustment circuitry configured to scale a bias voltage for individual PLLs based on a coarse tuning value accordance with various aspects described.

FIG. 2 illustrates a flowchart that outlines a method 200 for scaling the bias voltage to a PLL based on a target frequency for the PLL. The method 200 may be performed by the bias voltage adjustment circuitry 120 according to one embodiment. At 210, a scaled bias voltage for the voltage regulator is computed based at least on the target frequency. This step may be performed by the bias voltage adjustment circuitry 120 controlling the processor 122 perform the computation. The scaled bias voltage may be computed by determining a reduction value that is based at least on the target frequency and reducing a base bias voltage by the determined reduction amount.

In one embodiment instead of directly reading the value of the target frequency, a parameter having a value that is itself proportional to the target frequency may be used in the computation of the scaled bias voltage. In one embodiment, described below with reference to FIGS. 3 and 4, a coarse tuning (CT) value may be used in the computation of the scaled bias voltage.

At 220, the method includes applying or supplying the computed scaled bias voltage to the voltage regulator. This step may be performed by adjusting a setting on a pitch resistor or potentiometer that controls VBIAS or storing the scaled value for VBIAS in a register or memory location that is accessed by VBIAS control circuitry or by any other appropriate means.

Figure 3:
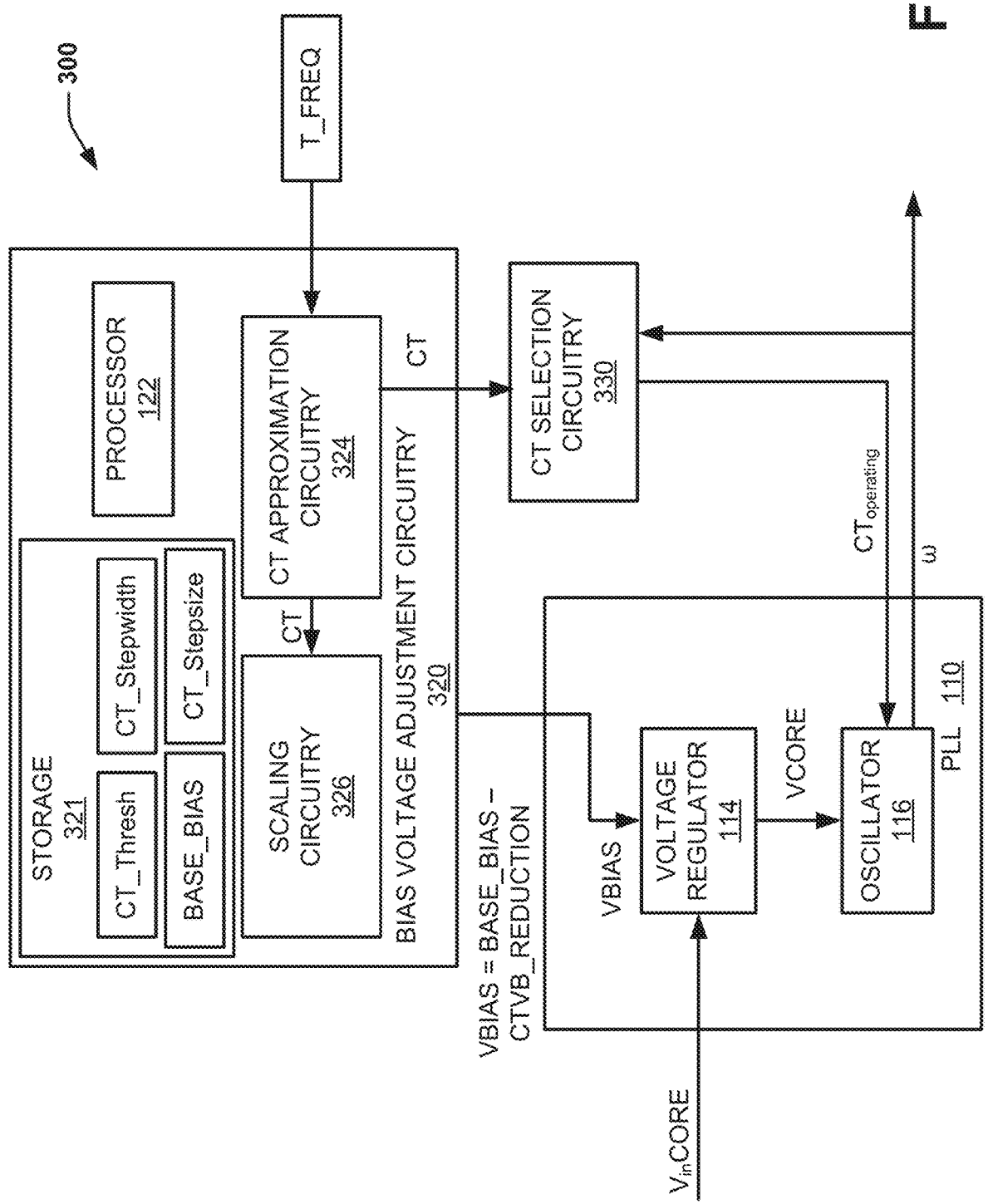
FIG. 3 illustrates a flow diagram of an exemplary method for frequency based PLL bias voltage scaling in a phase locked loop system in accordance with various aspects described.

FIG. 3 illustrates one example embodiment of PLL system 300 that includes bias voltage adjustment circuitry 320 configured to scale the base bias voltage for the oscillator based on a coarse tuning (CT) value that is determined for the oscillator 116. This embodiment is based on the fact that the target frequency for the oscillator is equal to $1/\text{sqrt}(L*C)$, where the capacitance C is proportional to the CT value. Thus, a relationship between the target frequency and the CT value may be deduced. Using the CT value, rather than the actual target frequency, to scale the base bias voltage may be advantageous because the CT value is often already calculated by coarse tuning circuitry. Further, parameters for voltage scaling as a function of CT value may be stored in storage 321 for use in quickly calculating the scaled bias voltage. In one embodiment, storage 321 is static random access memory (SRAM).

The bias voltage adjustment circuitry 320 includes CT approximation circuitry 324 and scaling circuitry 326. The CT approximation circuitry 324 may be any circuitry that determines an approximate or initial value for CT for the oscillator based on the target frequency. For example, the CT approximation circuitry 324 may be configured to access a mapping between target frequencies and CT values for a particular oscillator and select an approximate CT value mapped to a target frequency as a "starting point" for the coarse tuning process. The CT selection circuitry 330 revises the approximate CT value based on the frequency output by the oscillator 116 during open loop operation. Thus, the operating value of CT that is provided to the coarse tuning array (not shown) of the oscillator 116 may not always be equivalent to the approximate CT value that is computed by the CT approximation circuitry 324. In one embodiment, the CT approximation circuitry 324 and/or the CT selection circuitry 330 are embodied as described in U.S. patent application Ser. No. 14/578,773, which is directed to a fast band selection technique for PLLs and is incorporated by reference herein.

The scaling circuitry 326 inputs the approximate CT value from the CT approximation circuitry 324 and uses the approximate CT value to determine whether the base bias voltage BASE_BIAS for the oscillator 116 can be scaled down, and if so by how much. The scaling circuitry 326 determines a reduction value CTVB_REDUCTION based on the approximate CT value and calculates the scaled bias voltage by subtracting CTVB_REDUCTION from the base bias voltage. The scaling circuitry 326 is configured to provide the scaled bias voltage VBIAS to the PLL 110.

Figure 4:
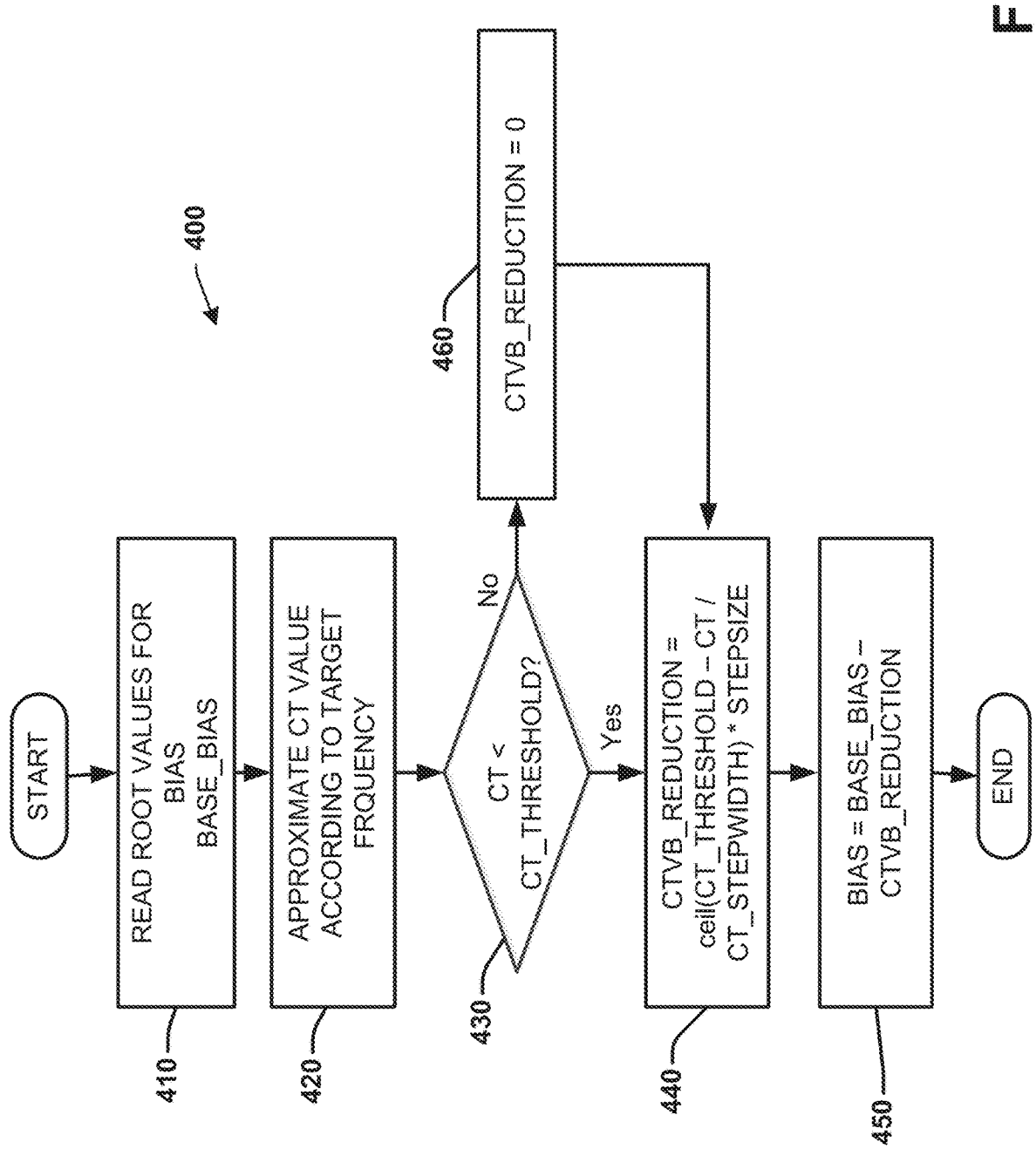
FIG. 4 illustrates a flow diagram of another exemplary method for coarse tuning value based PLL bias voltage scaling in a phase locked loop system in accordance with various aspects described.

FIG. 4 illustrates an example embodiment of a method 400 for scaling the base bias voltage based on an approximate CT value. The method 400 may be performed by the bias voltage adjustment circuitry 120 of FIG. 1 and/or 320 of FIG. 3. At 410, the method includes reading root values for the bias voltage also known as the base bias voltage (BASE_BIAS) for an oscillator in a PLL. This step may be performed by reading a memory location or register that stores these values as associated with a given oscillator. At 420 an approximate CT value is determined based on the target frequency using some appropriate method or mechanism. This step may be performed by the CT approximation circuitry 324 of FIG. 3.

At 430, the CT value is compared to a threshold value for CT (CT_THRESHOLD). The threshold value may be stored in storage 121 of FIG. 1 or 321 of FIG. 3. If the CT value is above the threshold, at 460 the reduction term CTVB_REDUCTION is set to zero. If the CT value is below the threshold, at 440 the reduction term CTVB_REDUCTION is calculated using the following equation.

$$CTVB\_REDUCTION = ceil((CT\_THRESHOLD-CT)/CT\_STEPWIDTH)*STEPSIZE \qquad Eq. 1$$

The "ceil" function is a rounding up function. The values for the scaling function parameters CT_STEPWIDTH and STEPSIZE may be stored in stored in storage 121 of FIG. 1 or 321 of FIG. 3. Appropriate values for the parameters may be done by simulation or laboratory measurement. Once a reduction term CTVB_REDUCTION is calculated at 440, at 450 the scaled bias voltage BIAS is computed as the base bias voltage BASE_BIAS minus the reduction term. This reduced or scaled bias voltage is applied to the voltage regulator 114 of FIGS. 1 and 3.

Figure 5:
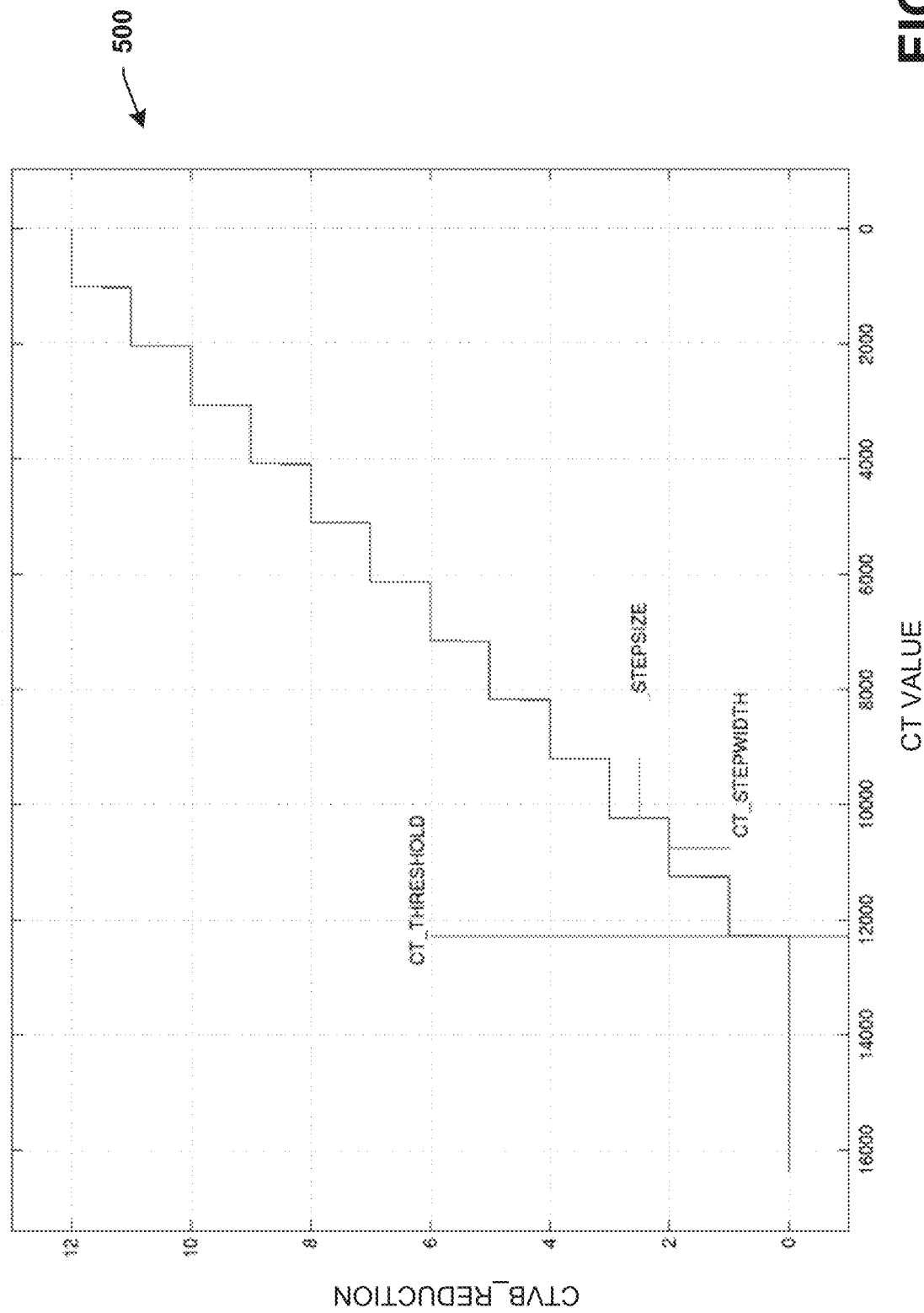
FIG. 5 illustrates an example bias voltage scaling curve in accordance with various aspects described.

FIG. 5 illustrates one example bias voltage scaling function in which the reduction term is a function of the CT value. The scaling function can be described as a series of steps that start at the threshold value. Each step has a width, or range of CT values, equal to CT_STEPWIDTH, and a height, or basic increment of bias voltage reduction (in terms of a pitch resistor setting increment), equal to STEPSIZE. The scaling function illustrated in FIG. 5 has CT_THRESHOLD equal to 12,250, CT_STEPWIDTH equal to 1,000, and STEPSIZE equal to a single pitch resistor setting increment (where the values for CT_VALUE are decimal values that can correspond to any frequency). Thus, the scaling function of FIG. 5 will yield a reduction term or pitch resistor setting of zero for a CT value above 12,250 and for every 1,000 below 12,250 the reduction term or pitch resistor setting increases by 1 increment. Of course, any number of scaling functions may be defined by changing the values of the parameters CT_THRESHOLD, CT_STEPWIDTH, and STEPSIZE. Alternatively a function that is a step type function may be defined and stored in an appropriate manner.

Figure 6:
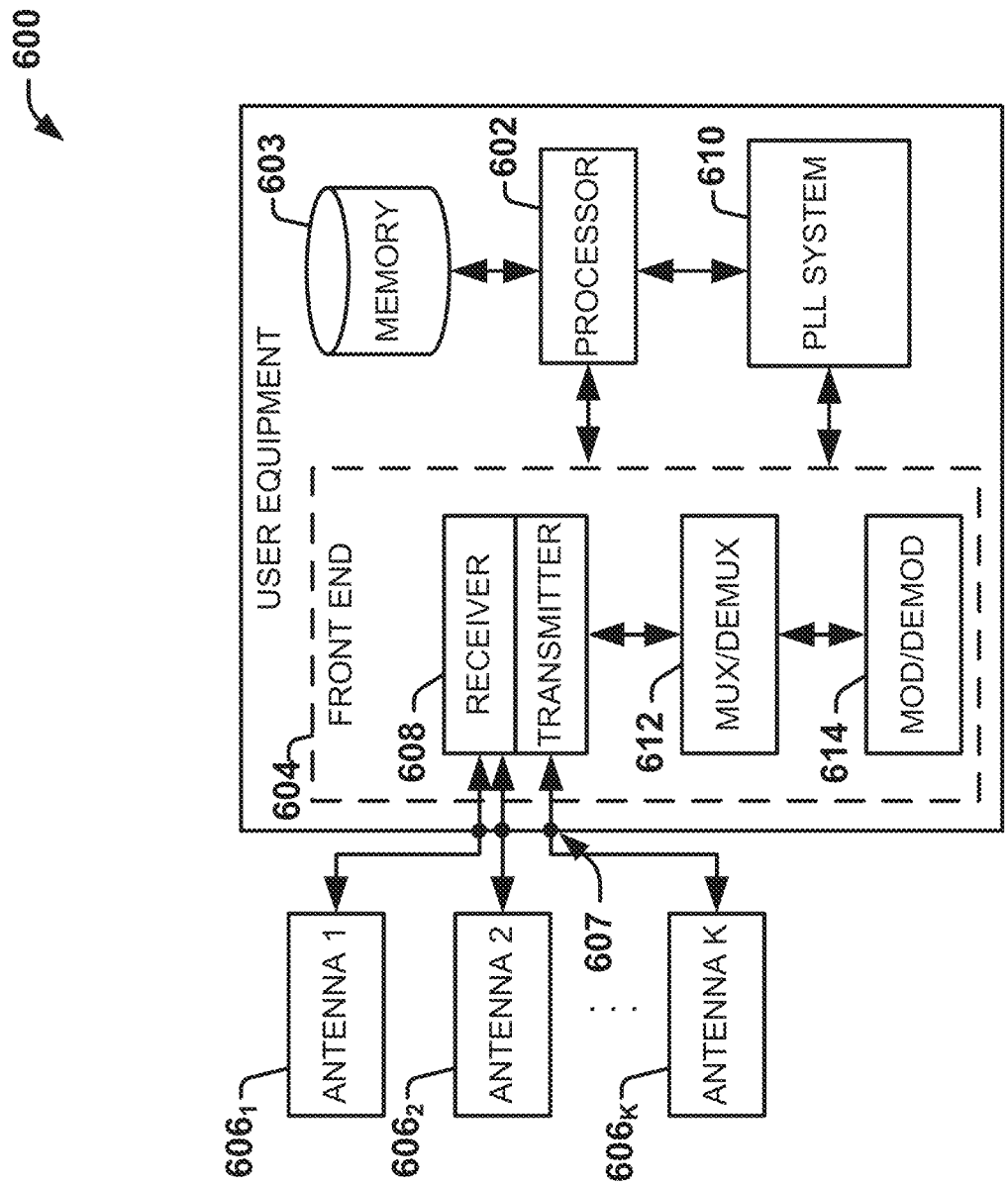
FIG. 6 illustrates an example user equipment device that includes a PLL system that utilizes frequency based bias voltage scaling in accordance with various aspects described.

To provide further context for various aspects of the disclosed subject matter, FIG. 6 illustrates a block diagram of an embodiment of user equipment 600 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 600 can be utilized with one or more aspects of the PLLs devices described herein according to various aspects. The user equipment device 600, for example, comprises a digital baseband processor 602 that can be coupled to a data store or memory 603, a front end 604 (e.g., an RF front end, an acoustic front end, or the other like front end) and a plurality of antenna ports 607 for connecting to a plurality of antennas $606_1$ to $606_k$ (k being a positive integer). The antennas $606_1$ to $606_k$ can receive and transmit signals to and from one or more wireless devices such as access points, access terminals, wireless ports, routers and so forth, which can operate within a radio access network or other communication network generated via a network device (not shown).

The user equipment 600 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 604 can include a communication platform, which comprises electronic components and associated circuitry that provide for processing, manipulation or shaping of the received or transmitted signals via one or more receivers or transmitters (e.g. transceivers) 608, a mux/demux component 612, and a mod/demod component 614. The front end 604 is coupled to the digital baseband processor 602 and the set of antenna ports 607, in which the set of antennas $606_1$ to $906_k$ can be part of the front end. In one aspect, the user equipment device 600 can comprise a phase locked loop system 610 that operates with frequency based bias voltage scaling according to aspects disclosed herein.

The processor 602 can confer functionality, at least in part, to substantially any electronic component within the mobile communication device 600, in accordance with aspects of the disclosure. As an example, the processor 600 can be configured to execute, at least in part, executable instructions that compute the scaled value of the bias voltage of various oscillators in the phase locked loop system 610. Thus the processor 600 may embody various aspects of the processor 122 of FIGS. 1 and 2 as a multi-mode operation chipset that affords frequency based bias voltage scaling for oscillators in the PLL system 610.

The processor 602 is functionally and/or communicatively coupled (e.g., through a memory bus) to memory 603 in order to store or retrieve information necessary to operate and confer functionality, at least in part, to communication platform or front end 604, the phase locked loop system 610 and substantially any other operational aspects of the phase locked loop system 610. The phase locked loop system 610 includes at least one oscillator (e.g., a VCO, DCO or the like) that can be calibrated via core voltage, a coarse tuning value, signal, word or selection process according the various aspects described herein.

The processor 602 can operate to enable the mobile communication device 600 to process data (e.g., symbols, bits, or chips) for multiplexing/demultiplexing with the mux/demux component 612, or modulation/demodulation via the mod/demod component 614, such as implementing direct and inverse fast Fourier transforms, selection of modulation rates, selection of data packet formats, inter-packet times, etc. Memory 603 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 603 may include a static random access memory (SRAM) that stores various parameters used for frequency based bias voltage scaling (e.g., the storage 121 of FIGS. 1 and 2).

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a phase locked loop system, including: bias voltage adjustment circuitry configured to compute a scaled bias voltage based at least on a target frequency for an oscillator; a voltage regulator configured to: input the scaled bias voltage and a selected core voltage, wherein the core voltage is selected based on the target operating frequency of the oscillator; generate a smoothed core voltage; and provide the smoothed core voltage to the oscillator.

Example 2 includes the subject matter of example 1, including or omitting optional elements, wherein the bias voltage adjustment circuitry is configured to compute the scaled bias voltage by: determining a reduction term based on the target frequency; and subtracting the reduction term from a base bias voltage associated with the oscillator.

Example 3 includes the subject matter of any of examples 1-2, including or omitting optional elements, wherein the bias voltage adjustment circuitry is configured to compute the scaled bias voltage by: determining a coarse tuning (CT) value associated with the target frequency; and computing the scaled bias voltage based at least on the CT value.

Example 4 includes the subject matter of example 3, including or omitting optional elements, wherein the bias voltage adjustment circuitry is configured to compute the scaled bias voltage by: determining a reduction term based on the CT value; and subtracting the reduction term from a base bias voltage associated with the oscillator.

Example 5 includes the subject matter of any of examples 1-2, including or omitting optional elements, wherein the bias voltage adjustment circuitry is configured to determine a reduction term equal to zero when the target frequency is below a threshold.

Example 6 includes the subject matter of any of examples 1-2, including or omitting optional elements, including storage media configured to store parameter values that define a series of incremental reduction term increases as a function of a series of decreasing target frequency bands; and where the bias voltage adjustment circuitry is configured to read the stored parameter values and use the parameter values to compute the reduction term.

Example 7 includes the subject matter of any of examples 1-2, including or omitting optional elements, wherein the storage media comprises static random access memory.

Example 8 includes the subject matter of any of examples 1-2, including or omitting optional elements, wherein the voltage regulator comprises a low dropout regulator.

Example 9 is a method, including: scaling a base bias voltage for a voltage regulator supplying a smoothed core voltage to an oscillator based at least on a target frequency for the oscillator; and applying the scaled bias voltage to the voltage regulator.

Example 10 includes the subject matter of example 9, including or omitting optional elements, wherein scaling the base bias voltage includes: determining a reduction term based on the target frequency; and subtracting the reduction term from a base bias voltage associated with the oscillator.

Example 11 includes the subject matter of any of examples 9-10, including or omitting optional elements, wherein scaling the base bias voltage includes: determining a coarse tuning (CT) value associated with the target frequency; and computing the scaled bias voltage based at least on the CT value.

Example 12 includes the subject matter of example 11, including or omitting optional elements, wherein scaling the base bias voltage includes: determining a reduction term based on the CT value; and subtracting the reduction term from a base bias voltage associated with the oscillator.

Example 13 includes the subject matter of any of examples 9-10, including or omitting optional elements, wherein scaling the base bias voltage includes determining a reduction term equal to zero when the target frequency is above a threshold.

Example 14 includes the subject matter of any of examples 9-10, including or omitting optional elements, further including: storing parameter values that define a series of incremental reduction term increases as a function of a series of decreasing target frequency bands; and reading the stored parameter values and using the parameter values to compute the reduction term.

Example 15 is a phase locked loop system, including an oscillator, a voltage regulator and bias voltage adjustment circuitry. The oscillator is configured to: input a smoothed core voltage; select an operating point based on the smoothed core voltage; and operate at the selected operating point to generate a signal having a frequency within a frequency band associated with the operating point. The voltage regulator is configured to: input a scaled bias voltage and a selected core voltage, wherein the core voltage is selected based on a target frequency of the oscillator; generate the smoothed core voltage; and provide the smoothed core voltage to the oscillator. The bias voltage adjustment circuitry is configured to compute the scaled bias voltage based at least on the target frequency.

Example 16 includes the subject matter of example 15, including or omitting optional elements, wherein the bias voltage adjustment circuitry is configured to compute the scaled bias voltage by: determining a reduction term based on the target frequency; and subtracting the reduction term from a base bias voltage associated with the oscillator.

Example 17 includes the subject matter of any of examples 15-16, including or omitting optional elements, wherein the bias voltage adjustment circuitry is configured to compute the scaled bias voltage by: determining a coarse tuning (CT) value associated with the target frequency; and computing the scaled bias voltage based at least on the CT value.

Example 18 includes the subject matter of example 17, including or omitting optional elements, wherein the bias voltage adjustment circuitry is configured to compute the scaled bias voltage by: determining a reduction term based on the CT value; and subtracting the reduction term from a base bias voltage associated with the oscillator.

Example 19 includes the subject matter of any of examples 15-16, including or omitting optional elements, wherein the bias voltage adjustment circuitry is configured to determine a reduction term equal to zero when the target frequency is below a threshold.

Example 20 includes the subject matter of any of examples 15-16, including or omitting optional elements, including: storage media configured to store parameter values that define a series of incremental reduction term increases as a function of a series of decreasing target frequency bands; and where the bias voltage adjustment circuitry is configured to read the stored parameter values and use the parameter values to compute the reduction term.

Example 21 includes the subject matter of any of examples 15-16, including or omitting optional elements, wherein the storage media comprises static random access memory.

Example 22 includes the subject matter of any of examples 15-16, including or omitting optional elements, wherein the voltage regulator comprises a low dropout regulator.

Example 23 is an apparatus, including: means for scaling a base bias voltage for a voltage regulator supplying a smoothed core voltage to an oscillator based at least on a target frequency for the oscillator; and means for applying the scaled bias voltage to the voltage regulator.

Example 24 includes the subject matter of example 23, including or omitting optional elements, wherein the means for scaling the base bias voltage includes: means for determining a reduction term based on the target frequency; and means for subtracting the reduction term from a base bias voltage associated with the oscillator.

Example 25 includes the subject matter of any of examples 23-24, including or omitting optional elements, wherein the means for scaling the base bias voltage includes: means for determining a coarse tuning (CT) value associated with the target frequency; and means for computing the scaled bias voltage based at least on the CT value.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A phase locked loop system, comprising:
   bias voltage adjustment circuitry configured to:
      determine a reduction term based at least on a target operating frequency for an oscillator; and
      subtract the reduction term from a base bias voltage associated with the oscillator to compute a scaled bias voltage;
   a voltage regulator configured to:
      input the scaled bias voltage and a selected core voltage, wherein the selected core voltage is selected based on the target operating frequency of the oscillator;
      generate a smoothed core voltage; and
      provide the smoothed core voltage to the oscillator.

2. The phase locked loop system of claim 1, wherein the bias voltage adjustment circuitry is configured to compute the scaled bias voltage by:
   determining a coarse tuning (CT) value associated with the target operating frequency; and
   computing the scaled bias voltage based at least on the CT value.

3. The phase locked loop system of claim 2, wherein the bias voltage adjustment circuitry is configured to compute the scaled bias voltage by:
   determining a reduction term based on the CT value; and
   subtracting the reduction term from a base bias voltage associated with the oscillator.

4. The phase locked loop system of claim 1 wherein the bias voltage adjustment circuitry is configured to determine a reduction term equal to zero when the target operating frequency is below a threshold.

5. The phase locked loop system of claim 1 comprising:
   storage media configured to store parameter values that define a series of incremental reduction term increases as a function of a series of decreasing target frequency bands; and where the bias voltage adjustment circuitry is configured to read the stored parameter values and use the parameter values to compute the reduction term.

6. The phased lock loop system of claim 5 wherein the storage media comprises static random access memory.

7. The phased lock loop system of claim 1 wherein the voltage regulator comprises a low dropout regulator.

8. A method, comprising:
determining a reduction term based at least on a target frequency for an oscillator;
subtracting the reduction term from a base bias voltage associated with the oscillator to compute a scaled bias voltage; and
applying the scaled bias voltage to a voltage regulator supplying a smoothed core voltage to the oscillator.

9. The method of claim 8, comprising:
determining a coarse tuning (CT) value associated with the target frequency; and
computing the scaled bias voltage based at least on the CT value.

10. The method of claim 9, comprising:
determining the reduction term based on the CT value; and
subtracting the reduction term from a base bias voltage associated with the oscillator.

11. The method of claim 8, comprising determining a reduction term equal to zero when the target frequency is above a threshold.

12. The method of claim 8, further comprising:
storing parameter values that define a series of incremental reduction term increases as a function of a series of decreasing target frequency bands; and
reading the stored parameter values and using the parameter values to determine the reduction term.

13. A phase locked loop system, comprising:
an oscillator configured to:
input a smoothed core voltage;
select an operating point based on the smoothed core voltage; and
operate at the selected operating point to generate a signal having a frequency within a frequency band associated with the operating point;
a voltage regulator configured to:
input a scaled bias voltage and a selected core voltage, wherein the selected core voltage is selected based on a target frequency of the oscillator;
generate the smoothed core voltage; and
provide the smoothed core voltage to the oscillator; and
bias voltage adjustment circuitry configured to compute the scaled bias voltage by:
determining a reduction term based at least on the target frequency; and
subtracting the reduction term from a base bias voltage associated with the oscillator.

14. The phase locked loop system of claim 13, wherein the bias voltage adjustment circuitry is configured to compute the scaled bias voltage by:
determining a coarse tuning (CT) value associated with the target frequency; and
computing the scaled bias voltage based at least on the CT value.

15. The phase locked loop system of claim 14, wherein the bias voltage adjustment circuitry is configured to compute the scaled bias voltage by:
determining a reduction term based on the CT value; and
subtracting the reduction term from a base bias voltage associated with the oscillator.

16. The phase locked loop system of claim 13, wherein the bias voltage adjustment circuitry is configured to determine a reduction term equal to zero when the target frequency is below a threshold.

17. The phase locked loop system of claim 13 comprising:
storage media configured to store parameter values that define a series of incremental reduction term increases as a function of a series of decreasing target frequency bands; and
where the bias voltage adjustment circuitry is configured to read the stored parameter values and use the parameter values to compute the reduction term.

18. The phased lock loop system of claim 17 wherein the storage media comprises static random access memory.

19. The phased lock loop system of claim 13 wherein the voltage regulator comprises a low dropout regulator.

* * * * *